United States Patent
Kim et al.

(10) Patent No.: US 10,903,053 B2
(45) Date of Patent: Jan. 26, 2021

(54) PLASMA PROCESSING APPARATUS

(71) Applicant: Samsung Electronics Co., Ltd., Suwon-si (KR)

(72) Inventors: Hak Young Kim, Bucheon-si (KR); Jung Pyo Hong, Seoul (KR); Jong Woo Sun, Hwaseong-si (KR); Doug Yong Sung, Seoul (KR); Yong Ho Lim, Suwon-si (KR); Yun Kwang Jeon, Seoul (KR); Hwa Jun Jung, Ansan-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/549,408

(22) Filed: Aug. 23, 2019

(65) Prior Publication Data

US 2019/0378693 A1   Dec. 12, 2019

Related U.S. Application Data

(63) Continuation of application No. 15/415,403, filed on Jan. 25, 2017, now Pat. No. 10,395,900.

(30) Foreign Application Priority Data

Jun. 17, 2016  (KR) .................. 10-2016-0075871

(51) Int. Cl.
  *H01J 37/32*  (2006.01)
  *H01L 21/67*  (2006.01)

(52) U.S. Cl.
  CPC ........ *H01J 37/3244* (2013.01); *H01J 37/321* (2013.01); *H01J 37/32119* (2013.01);
  (Continued)

(58) Field of Classification Search
  CPC ............. H01J 37/3244; H01J 37/32449; H01J 37/321; H01J 37/32119; H01J 37/32458; H01J 2237/334; H01L 21/67069
  (Continued)

(56) References Cited

U.S. PATENT DOCUMENTS 1,968,348 A * 7/1934 Placide ................... B05B 1/02
                                                      239/590.5
3,352,492 A * 11/1967 Cape ..................... B05B 7/1413
                                                      239/85

(Continued)

FOREIGN PATENT DOCUMENTS

CN         1830069 A        9/2006
CN       104241070 A       12/2014

(Continued)

OTHER PUBLICATIONS

Office Action for corresponding Chinese Application No. 201710325905.X, dated Jul. 3, 2020, 7 pages, no translation.

*Primary Examiner* — Rudy Zervigon
(74) *Attorney, Agent, or Firm* — Myers Bigel, P.A.

(57) ABSTRACT

A plasma processing apparatus includes a chamber, a window plate disposed in an upper portion of the chamber and having a fastening hole defined therein, an injector having a body part including a plurality of nozzles and configured to be fastened to the fastening hole, and a flange part extending radially from the body part to partially cover a bottom surface of the window plate when the body part is fastened to the fastening hole, and a stopper configured to be fastened to the body part on an upper surface of the window plate to hold the injector in the fastening hole when the body part is fastened to the fastening hole.

14 Claims, 17 Drawing Sheets

(52) U.S. Cl.
CPC .. *H01J 37/32449* (2013.01); *H01J 37/32458* (2013.01); *H01L 21/67069* (2013.01); *H01J 2237/334* (2013.01)

(58) Field of Classification Search
USPC ............. 118/723 AN; 156/345.48, 345.49
See application file for complete search history.

(56) References Cited

U.S. PATENT DOCUMENTS

| | | | | |
|---|---|---|---|---|
| 3,592,575 | A * | 7/1971 | Jaeger | F23D 17/00 431/114 |
| 3,745,969 | A * | 7/1973 | Huffman | C23C 16/4584 118/730 |
| 3,881,863 | A * | 5/1975 | Creuz | F24H 9/1881 432/222 |
| 3,995,811 | A * | 12/1976 | Broderick | B05B 7/206 239/85 |
| 4,069,974 | A * | 1/1978 | Zawacki | B05B 5/032 239/706 |
| 4,080,927 | A * | 3/1978 | Brown | G21C 3/626 118/716 |
| 4,293,755 | A * | 10/1981 | Hill | C23C 16/4411 118/50.1 |
| 4,313,721 | A * | 2/1982 | Henriques | F23D 11/406 239/424.5 |
| 4,389,229 | A * | 6/1983 | Jang | B07B 7/02 118/692 |
| 4,439,401 | A * | 3/1984 | Voll | C09C 1/50 422/150 |
| 4,481,228 | A * | 11/1984 | Morel | B05B 5/08 118/626 |
| 4,730,775 | A * | 3/1988 | Maas | B05B 1/28 239/120 |
| 4,854,263 | A * | 8/1989 | Chang | C23C 16/345 118/715 |
| 4,911,102 | A * | 3/1990 | Manabe | C23C 16/455 117/102 |
| 5,002,928 | A * | 3/1991 | Fukui | B05B 17/0623 427/110 |
| 5,105,761 | A * | 4/1992 | Charlet | H01J 37/3244 118/719 |
| 5,134,965 | A * | 8/1992 | Tokuda | C23C 16/45502 118/715 |
| 5,169,509 | A * | 12/1992 | Latz | C23C 14/0063 204/192.13 |
| 5,232,164 | A * | 8/1993 | Resch | B05B 1/265 239/424 |
| 5,290,993 | A * | 3/1994 | Kaji | H01J 37/32192 156/345.42 |
| 5,297,738 | A * | 3/1994 | Lehr | B05B 1/3442 239/493 |
| 5,522,934 | A * | 6/1996 | Suzuki | C23C 16/455 118/723 AN |
| 5,532,190 | A * | 7/1996 | Goodyear | C23C 16/45512 118/715 |
| 5,547,714 | A * | 8/1996 | Huck | A61F 2/30767 264/317 |
| 5,556,521 | A * | 9/1996 | Ghanbari | H01J 37/321 118/723 I |
| 5,567,267 | A * | 10/1996 | Kazama | H01J 37/32 118/724 |
| 5,614,055 | A * | 3/1997 | Fairbairn | H01J 37/321 118/723 AN |
| 5,643,394 | A * | 7/1997 | Maydan | C23C 16/45574 118/723 E |
| 5,678,595 | A * | 10/1997 | Iwabuchi | F16K 49/002 137/341 |
| 5,685,942 | A * | 11/1997 | Ishii | H01J 37/32082 156/345.48 |
| 5,728,223 | A * | 3/1998 | Murakami | C23C 16/455 118/715 |
| 5,772,771 | A * | 6/1998 | Li | C23C 16/4405 118/715 |
| 5,885,358 | A * | 3/1999 | Maydan | C23C 16/455 118/715 |
| 5,935,373 | A * | 8/1999 | Koshimizu | H01J 37/321 118/723 I |
| 5,992,453 | A * | 11/1999 | Zimmer | B05C 1/10 137/561 A |
| 6,013,155 | A * | 1/2000 | McMillin | C23C 16/455 118/723 I |
| 6,070,551 | A * | 6/2000 | Li | C23C 16/401 118/715 |
| 6,077,357 | A * | 6/2000 | Rossman | C23C 16/4585 118/723 R |
| 6,086,679 | A * | 7/2000 | Lee | B05D 1/60 118/724 |
| 6,106,663 | A * | 8/2000 | Kuthi | H01J 37/32009 118/50.1 |
| 6,132,512 | A * | 10/2000 | Horie | C23C 16/45565 118/715 |
| 6,143,078 | A * | 11/2000 | Ishikawa | H01L 21/67017 118/715 |
| 6,230,651 | B1 * | 5/2001 | Ni | H01J 37/3244 118/723 I |
| 6,257,168 | B1 * | 7/2001 | Ni | H01J 37/32623 118/723 R |
| 6,270,862 | B1 * | 8/2001 | McMillin | C23C 16/455 427/569 |
| 6,299,692 | B1 * | 10/2001 | Ku | C23C 16/4485 118/715 |
| 6,302,965 | B1 * | 10/2001 | Umotoy | C23C 16/16 118/715 |
| 6,450,117 | B1 * | 9/2002 | Murugesh | C23C 16/4402 118/723 ER |
| 6,453,992 | B1 * | 9/2002 | Kim | C23C 16/45565 118/666 |
| 6,486,081 | B1 | 11/2002 | Ishikawa et al. | |
| 6,916,398 | B2 * | 7/2005 | Chen | C23C 16/34 118/715 |
| 6,921,437 | B1 | 7/2005 | Dedontney et al. | |
| 7,081,711 | B2 * | 7/2006 | Glidden | H01J 27/02 156/345.48 |
| 7,314,526 | B1 * | 1/2008 | Preti | C30B 25/14 118/715 |
| 7,510,624 | B2 * | 3/2009 | Liang | C23C 16/45563 118/715 |
| 7,758,698 | B2 * | 7/2010 | Bang | C23C 16/4405 118/715 |
| 7,785,417 | B2 * | 8/2010 | Ni | H01J 37/3244 118/715 |
| 7,833,885 | B2 * | 11/2010 | Won | C23C 16/26 257/67 |
| 8,114,245 | B2 * | 2/2012 | Ohmi | H01J 37/32082 118/663 |
| 8,137,463 | B2 * | 3/2012 | Liu | H01J 37/32449 118/715 |
| 8,291,857 | B2 * | 10/2012 | Lam | C23C 16/4412 118/723 ME |
| 8,343,277 | B2 * | 1/2013 | Takebayashi | C23C 16/4402 118/715 |
| 8,524,099 | B2 | 9/2013 | Bogart et al. | |
| 8,741,062 | B2 * | 6/2014 | Lindfors | C23C 16/4485 118/715 |
| 8,858,754 | B2 * | 10/2014 | Horiguchi | H01J 37/3244 118/723 E |
| 9,051,647 | B2 * | 6/2015 | Cooperberg | C23C 16/45574 |
| 9,162,236 | B2 | 10/2015 | Nangoy et al. | |
| 9,175,394 | B2 * | 11/2015 | Yudovsky | C23C 16/45504 |
| 9,502,237 | B2 * | 11/2016 | Yamaguchi | C23C 16/45565 |
| 9,536,710 | B2 * | 1/2017 | Knyazik | H01J 37/3244 |
| 9,837,286 | B2 * | 12/2017 | Yang | H01J 37/321 |
| 9,845,550 | B2 * | 12/2017 | Brillhart | C30B 25/14 |
| 10,147,588 | B2 * | 12/2018 | Eason | H01J 37/32449 |
| 10,163,606 | B2 * | 12/2018 | Rozenzon | H01J 37/3244 |
| 10,249,511 | B2 * | 4/2019 | Sriraman | H01L 21/32136 |

(56) References Cited

U.S. PATENT DOCUMENTS

| | | | | |
|---|---|---|---|---|
| 2001/0010257 A1* | 8/2001 | Ni | ................... | H01J 37/3244 156/345.33 |
| 2002/0086106 A1* | 7/2002 | Park | ................... | C23C 16/403 427/248.1 |
| 2002/0088545 A1* | 7/2002 | Lee | ................... | C23C 16/45565 156/345.33 |
| 2002/0129768 A1* | 9/2002 | Carpenter | ......... | C23C 16/45544 118/715 |
| 2002/0179247 A1* | 12/2002 | Davis | ................. | C23C 16/4405 156/345.33 |
| 2003/0000924 A1* | 1/2003 | Strang | ............... | C23C 16/45523 216/86 |
| 2003/0070620 A1* | 4/2003 | Cooperberg | ...... | C23C 16/45574 118/723 AN |
| 2003/0141178 A1* | 7/2003 | Shan | ................... | C23C 16/452 204/157.15 |
| 2004/0187779 A1* | 9/2004 | Park | ................... | C23C 16/4404 118/715 |
| 2005/0092245 A1* | 5/2005 | Moon | ................. | C23C 16/45512 118/715 |
| 2006/0096540 A1* | 5/2006 | Choi | ................. | C23C 16/45574 118/724 |
| 2006/0196420 A1* | 9/2006 | Ushakov | ......... | C23C 16/45563 118/715 |
| 2006/0219361 A1* | 10/2006 | Wang | ............... | H01J 37/32357 156/345.33 |
| 2007/0119371 A1* | 5/2007 | Ma | .................... | C23C 16/18 118/723 E |
| 2007/0187363 A1* | 8/2007 | Oka | .................. | H01J 37/3244 216/59 |
| 2009/0159424 A1* | 6/2009 | Liu | .................... | H01J 37/3244 204/164 |
| 2010/0263588 A1* | 10/2010 | Zhiyin | .............. | C23C 16/45508 117/98 |
| 2011/0162800 A1* | 7/2011 | Noorbakhsh | ..... | C23C 16/45565 156/345.34 |
| 2011/0198417 A1* | 8/2011 | Detmar | ................. | H01J 37/321 239/569 |
| 2013/0052830 A1* | 2/2013 | Kim | .................. | C23C 16/45574 438/700 |
| 2013/0098554 A1 | 4/2013 | Chhatre et al. | | |
| 2013/0269613 A1* | 10/2013 | Sanchez | ............ | H01L 21/02104 118/724 |
| 2013/0284700 A1* | 10/2013 | Nangoy | .................. | B05B 1/185 216/58 |
| 2014/0024142 A1 | 1/2014 | Shriner et al. | | |
| 2014/0061324 A1* | 3/2014 | Mohn | ................. | H01J 37/3244 239/1 |
| 2014/0083615 A1 | 3/2014 | Kim et al. | | |
| 2014/0262034 A1* | 9/2014 | Ishibashi | ........... | C23C 16/45563 156/345.29 |
| 2015/0059979 A1 | 3/2015 | Kim et al. | | |
| 2015/0233016 A1* | 8/2015 | Brillhart | ................. | C30B 25/14 222/3 |
| 2015/0371826 A1 | 12/2015 | Rozenzon et al. | | |
| 2016/0033070 A1* | 2/2016 | Brillhart | ............. | C23C 16/4412 137/565.01 |
| 2016/0047040 A1 | 2/2016 | Mishra et al. | | |
| 2016/0293431 A1* | 10/2016 | Sriraman | ............ | H01L 21/3065 |
| 2017/0365444 A1* | 12/2017 | Kim | ................... | H01J 37/32119 |
| 2019/0080944 A1* | 3/2019 | Sun | ................... | H01L 21/67253 |

FOREIGN PATENT DOCUMENTS

| | | | | |
|---|---|---|---|---|
| JP | 58170982 | | 10/1983 | |
| JP | 58170982 A | * | 10/1983 | ........... F16K 31/086 |
| JP | 2002252204 | | 9/2002 | |
| JP | 2002252204 A | * | 9/2002 | ....... C23C 16/45565 |
| JP | 2010251708 | | 11/2010 | |
| JP | 2011029645 | | 2/2011 | |
| JP | 2011029645 A | * | 2/2011 | ....... C23C 16/45574 |
| JP | 2013042160 | | 2/2013 | |
| JP | 2013042160 A | * | 2/2013 | ........... H01J 37/321 |
| JP | 2013089972 | | 5/2013 | |
| JP | 2013089972 A | * | 5/2013 | ............... H05H 1/30 |
| JP | 2017175121 | | 9/2017 | |
| JP | 2017175121 A | * | 9/2017 | ........ H01J 37/32082 |
| KR | 101139821 | | 4/2012 | |
| KR | 101297264 | | 3/2013 | |
| KR | 101253296 | | 4/2013 | |
| KR | 101385699 | | 4/2014 | |
| KR | 101411993 | | 4/2014 | |

* cited by examiner

PLASMA PROCESSING APPARATUS

CROSS-REFERENCE TO RELATED APPLICATIONS

This application is a continuation of U.S. patent application Ser. No. 15/415,403, filed on Jan. 25, 2017, which claims the benefit of priority to Korean Patent Application No. 10-2016-0075871, filed on Jun. 17, 2016 in the Korean Intellectual Property Office, the disclosures of which are incorporated herein by reference in their entireties.

BACKGROUND

The present inventive concept relates to plasma processing apparatus.

A plasma processing apparatus is commonly used for manufacturing semiconductor devices, Light Emitting Diodes (LED), Liquid Crystal Displays (LCD), or the like. Thereamong, an ICP-type etching apparatus includes a hole in the center of a window plate, an RF Power transmission path, and a nozzle mounted in the hole to inject a process gas into a chamber. A process gas is excited to a plasma state inside the chamber and collides with an etching target (for example, a wafer) to perform an etching process.

Here, a hole peripheral region of the window plate including the nozzle is structurally vulnerable, as compared to a different region of the window plate, thereby leading to particulation due to plasma damage. Particularly, when the window plate is reused after having been cleaned by a chemical cleaning agent or after having been polished, the hole peripheral region of the window plate may be exposed to plasma to accelerate degradation thereof, and thus, the hole peripheral region is vulnerable to particulation. In addition, a service life of window plate may be limited according to the number of washes thereof.

Generally, a process gas is injected through a nozzle in a vertical direction, and a mixture momentum of the process gas is less in a lower pressure region inside a chamber, which may lead to non-uniform distribution of a process gas in a wafer edge region. Therefore, a problem such as a product yield decrease or the like may be caused.

SUMMARY

An aspect of the present inventive concept may provide a method of reducing structural vulnerabilities of a window plate and implementing uniform dispersion of a process gas inside a chamber.

According to an aspect of the present inventive concept, a plasma processing apparatus may include: a chamber; a window plate disposed in an upper portion of the chamber and having a fastening hole defined therein; an injector having a body part including a plurality of nozzles and configured to be fastened to the fastening hole, and a flange part extending radially from the body part to partially cover a bottom surface of the window plate when the body part is fastened to the fastening hole; and a stopper configured to be fastened to the body part on an upper surface of the window plate to hold the injector in the fastening hole when the body part is fastened to the fastening hole.

According to an aspect of the present inventive concept, a plasma processing apparatus may include: a chamber; a window plate disposed in an upper portion of the chamber and having a fastening hole; and an injector configured to be disposed in the fastening hole and including a first body having a plurality of distribution nozzles for distributing a process gas, and a second body having an accommodating groove to which the first body is configured to be fastened and having a plurality of injection nozzles for injecting the process gas to an interior of the chamber when the injector is disposed in the fastening hole.

According to an aspect of the present inventive concept, a plasma processing apparatus may include: a chamber; a window plate in an upper portion of the chamber; a fastening hole defined in a central portion of the window plate; an injector; and a flange. The injector may include: a body configured to be fastened to the fastening hole; a plurality of first injection nozzles defined in a side surface of the body and configured to inject a process gas away from the side surface when the body is fastened to the fastening hole; and a plurality of second injection nozzles defined in a bottom surface of the body and configured to inject the process gas downwardly away from the bottom surface when the body is fastened to the fastening hole. The flange may extend radially away from the body of the injector and may be configured to be positioned at a bottom surface of the window plate when the body is fastened to the fastening hole to cover and protect a region around the outer periphery of the fastening hole.

BRIEF DESCRIPTION OF DRAWINGS

The above and other aspects, features and other advantages of the present inventive concept will be more clearly understood from the following detailed description, taken in conjunction with the accompanying drawings, in which.

DETAILED DESCRIPTION

Figure 1:
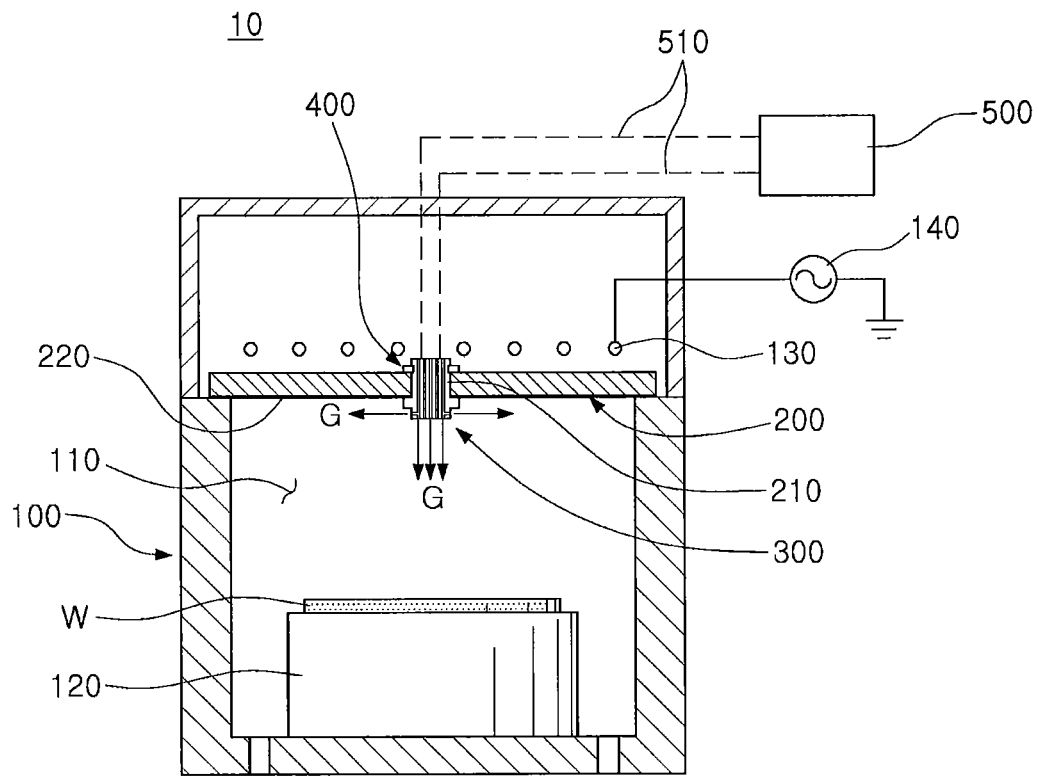
FIG. 1 is a cross-sectional view schematically illustrating a plasma processing apparatus according to an example embodiment.

With reference to FIG. 1, a plasma processing apparatus according to an example embodiment is described below. FIG. 1 is a cross-sectional view schematically illustrating a plasma processing apparatus according to an example embodiment.

With reference to FIG. 1, a plasma processing apparatus 10 according to an example embodiment may process a wafer W using plasma. For example, an etching process with respect to the wafer W may be performed. The plasma processing apparatus 10 may include a chamber 100, a window plate 200, an injector 300, and a stopper 400.

The chamber 100 may define or provide an internal space 110 in which a processing process with respect to the wafer W is performed. The chamber 100 may be formed of a solid material such as, for example, a metal.

A support member 120 on which the wafer W for manufacturing a semiconductor device is disposed may be disposed at or in a lower portion of the internal space 110. The support member 120 may, for example, include an electrostatic chuck (ESC).

The window plate 200 may be disposed at or in an upper portion of the chamber 100, and may seal the internal space 110 of the chamber 100.

An inductively coupled plasma (ICP) antenna 130 may be disposed above the window plate 200. The ICP antenna 130 may be connected to a plasma power source 140 to form an electromagnetic field in the internal space 110 of the chamber 100.

The window plate 200 may be formed of a dielectric material, for example, a nonconductive ceramic such as $Al_2O_3$ or the like, quartz or the like, but is not limited thereto.

Figure 2:
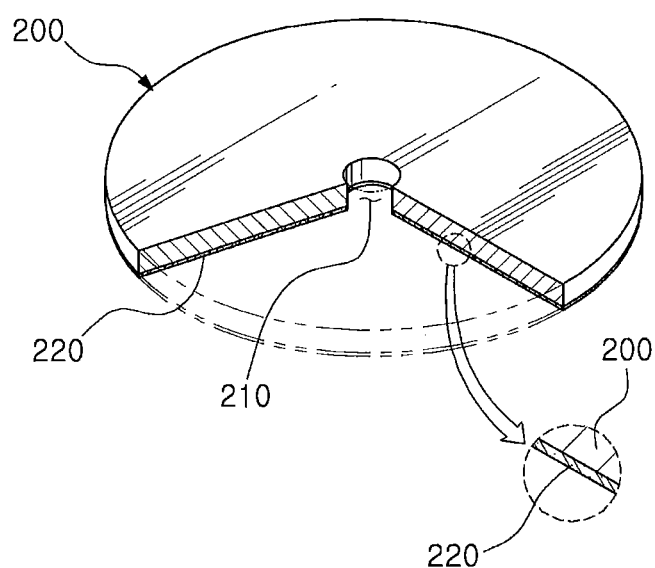
FIG. 2 is a cutaway perspective view schematically illustrating a window plate in the plasma processing apparatus of FIG. 1.

FIG. 2 schematically illustrates the window plate 200. With reference to FIG. 2, the window plate 200 may have a fastening hole 210. The fastening hole 210 may be located substantially at the center of the window plate 200, and may extend or penetrate through the window plate 200. The injector 300, to be described later, may be disposed in the fastening hole 210.

The window plate 200 may have a protective layer 220 on a bottom surface facing or exposed to the internal space 110. The protective layer 220 may be formed of a material having excellent etch-resistance properties, for example, yttrium oxide ($Y_2O_3$).

The protective layer 220 may, for example, be formed in a method in which a bottom surface of the window plate 200 is coated at a thickness of several tens of micrometers (μm) to several hundreds of micrometers (μm).

The injector 300 may inject a process gas G to the internal space 110 of the chamber 100. The injector 300 may be detachably or releasably mounted in or on the fastening hole 210 of the window plate 200.

Figure 3A:
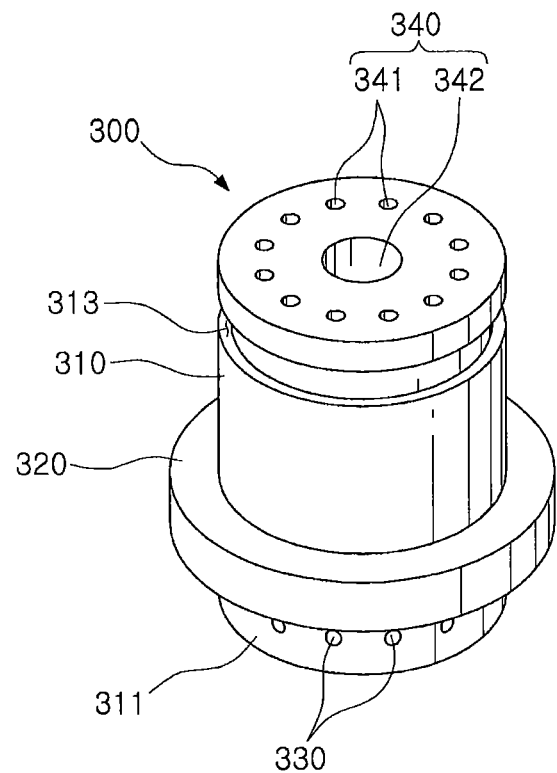
FIGS. 3A and 3B are perspective views schematically illustrating an injector in the plasma processing apparatus of FIG. 1.
Figure 3B:
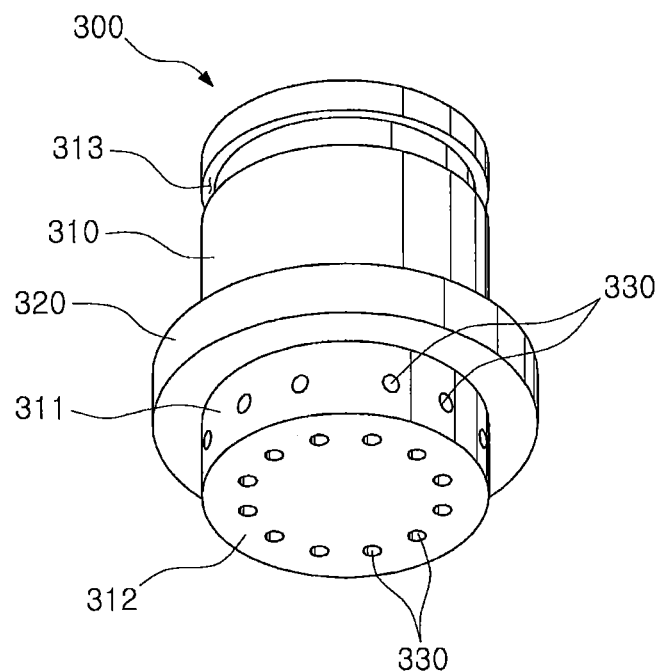
Figure 4:
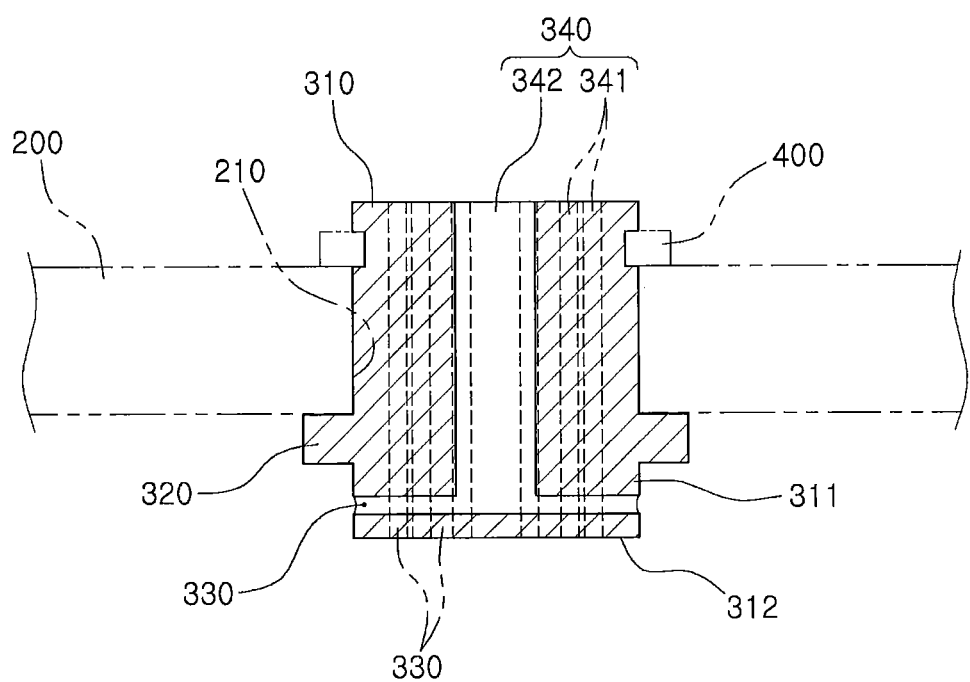
FIG. 4 is a cross-sectional view schematically illustrating the injector of FIG. 3A.

With reference to FIGS. 3A to 4, the injector 300 will be described in further detail. FIGS. 3A and 3B are perspective views schematically illustrating an injector in the plasma processing apparatus of FIG. 1, and FIG. 4 is a cross-sectional view schematically illustrating the injector in FIG. 3A.

With reference to FIGS. 3A and 3B, the injector 300 may include a body part or portion 310 and a flange part or portion 320. The body part 310 and the flange part 320 may be formed of, for example, quartz, yttrium oxide, ceramic or the like, but is not limited thereto.

The body part 310 may be fastened to the fastening hole 210 of the window plate 200. The body part 310 may have a substantially cylindrical shape or structure, and may protrude from an upper surface and a bottom surface of the window plate 200 when fastened to the fastening hole 210.

The flange part 320 may extend radially away from the body part 310. The flange part 320 may be provided along a circumference of the body part 310 in an area of the body part 310 protruding from the bottom surface of the window plate 200. In other words, an upper surface of the flange part 320 may be adjacent and/or abut a bottom surface of the window plate 200.

The flange part 320 may partially cover the bottom surface of the window plate 200. In detail, the flange part 320 may cover a region around the fastening hole 210 of the bottom surface of the window plate 200 so that region is not exposed to plasma when an etching process is performed.

The body part 310 may have a lateral or side surface 311 extending from the flange part 320 toward a lower portion of the chamber 100, and the body part 310 may have a lower surface 312. In addition, the body part 310 may have a plurality of nozzle holes or injection nozzles 330 defined in the lower surface 312 and in the lateral surface 311, respectively.

The body part 310 may have a plurality of nozzles or distribution nozzles 340 connected to the plurality of nozzle holes 330. The plurality of nozzles or distribution nozzles 340 may include first nozzles or distribution nozzles 341 and a second nozzle or distribution nozzle 342.

With reference to FIG. 4, the first nozzles 341 may extend in a longitudinal direction of the body part 310 to connect to nozzle holes 330 formed on the lower surface 312 of the body part 310. The second nozzle 342 may bend or turn toward the lateral surface 311 of the body part 310 to connect to the nozzle holes 330 formed on the lateral surface 311. The plurality of nozzles 340 may be connected to a tank 500 for storing the process gas G through a supply pipe 510 (referring to FIG. 1).

The injector 300 may inject the process gas G through the first nozzles 341 in a downward or vertical direction of the body part 310. In addition, the injector 300 may radially inject the process gas G through the second nozzle 342 in a horizontal direction of the body part 310.

The process gases G may be distributed through the first nozzles 341 and the second nozzle 342 in different directions, thereby increasing a mixture of the process gases G inside the chamber 100. Thus, distribution in which the process gas G is distributed inside the chamber 100 may be improved, thereby improving a yield of a product.

Figure 5A:
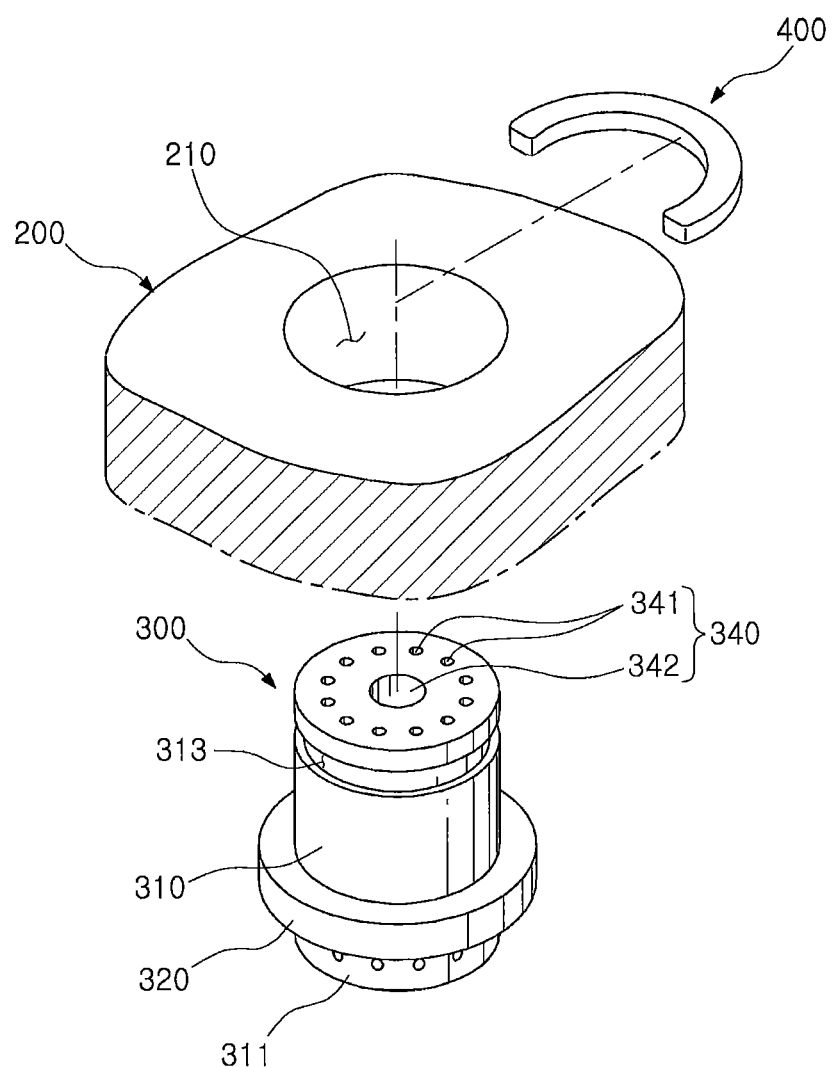
FIGS. 5A and 5B are a perspective view and a cross-sectional view schematically illustrating a structure in which an injector is fixed to a window plate by a stopper.
Figure 5B:
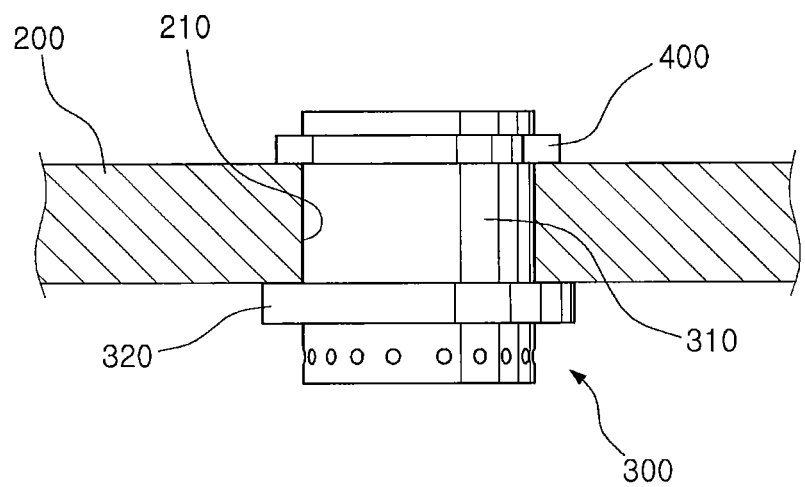

The stopper 400 may be fastened to the body part 310 at an upper surface of the window plate 200. With reference to FIGS. 5A and 5B, the stopper 400 may be fastened to an area of the body part 310 protruding from an upper surface of the window plate 200 when the body part 310 is fastened to the fastening hole 210.

The injector 300 may be fastened to the fastening hole 210 in a manner in which the body part 310 is inserted into the fastening hole 210 in a direction toward a bottom surface of the window plate 200 to allow the flange part 320 to be in contact with the bottom surface of the window plate 200 around the fastening hole 210. The stopper 400 is fastened to the body part 310 at an upper surface of the window plate 200 to be caught by or rest on an upper surface of the window plate 200 to inhibit or prevent the injector 300 from being detached from the fastening hole 210 and falling into the interior of the chamber 100.

In an example embodiment, the stopper 400 is inserted into and received in a groove 313 formed in the body part 310, but the inventive concept is not limited thereto.

As described above, according to an example embodiment, the injector 300 fastened to the fastening hole 210 of the window plate 200 has the flange part 320 radially protruding from the body part 310, and thus, when the injector 300 is fastened to the fastening hole 210, a structure in which the flange part 320 covers a bottom surface of the window plate 200 around the fastening hole 210 may be implemented.

A bottom surface of the window plate 200 is coated with the protective layer 220 formed of a material having etch-resistant properties so as to be protected, but a peripheral region of the fastening hole 210 is limited to being smoothly coated, and therefore is structurally weak relative to a different region of the window plate 200. Thus, particulation may be caused in this region around the fastening hole 210 by repeated plasma damage.

In an example embodiment, a vulnerable region around the fastening hole 210 is covered with the flange part 320 so as to not be exposed to plasma. Thus, particulation may be inhibited or prevented, and the service life time of the window plate 200 may be efficiently managed.

Figure 6:
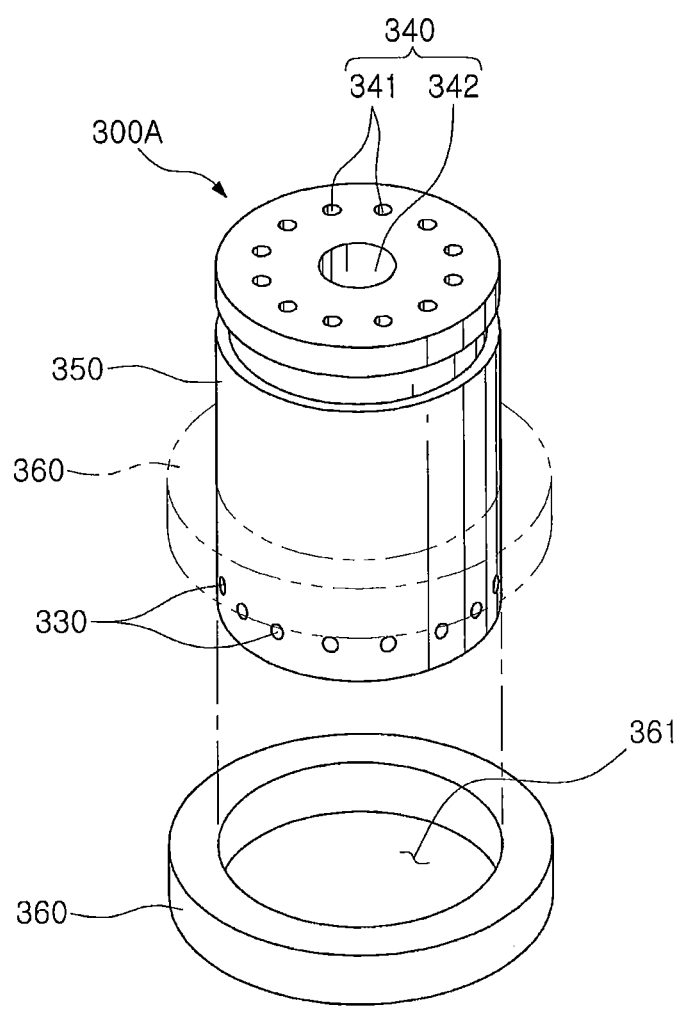
FIG. 6 is a perspective view schematically illustrating an injector according to an example embodiment.

FIG. 6 schematically illustrates a modified example of the injector. FIG. 6 is a perspective view schematically illustrating an injector according to this example embodiment.

With reference to FIG. 6, an injector 300A according to an example embodiment may include a body part 350 having a plurality of nozzles or distribution nozzles 340 and a plurality of nozzle holes or injection nozzles 330, and a flange part 360 detachably or releasably fastened to the body part 350. In other words, while the injector 300 according to an example embodiment in FIG. 1 has a structure in which the body part 310 is integrated with the flange part 320, the injector 300A according to an example embodiment in FIG. 6 has a structure in which the body part 350 is separated from the flange part 360. In other words, the body part 350 and the flange part 360 may be separate components.

The body part 350 has a cylindrical shape or structure, and the flange part 360 may have a through hole 361 into which the body part 350 is inserted. The through hole 361 may have a shape corresponding to a cross-sectional shape of the body part 350.

The flange part 360 may be fastened to the body part 350 with a structure inserted into and fixed to the body part 350.

Figure 7A:
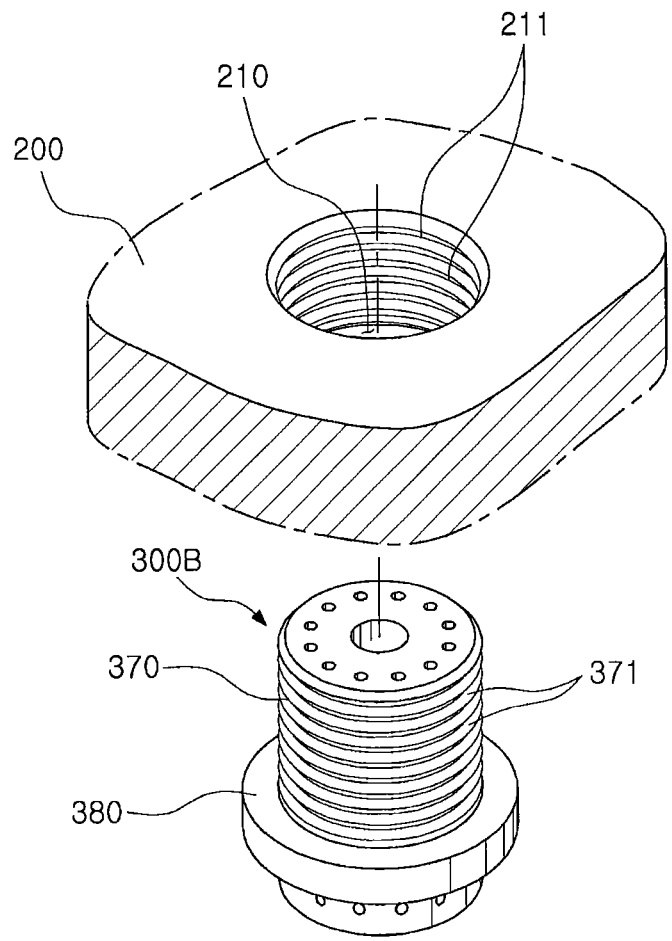
FIGS. 7A and 7B are a perspective view and a cross-sectional view schematically illustrating an injector according to an example embodiment.
Figure 7B:
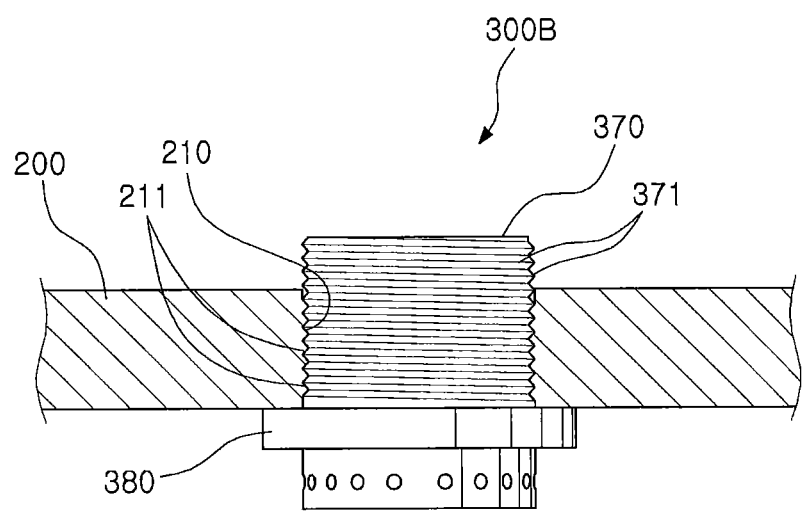

FIGS. 7A and 7B schematically illustrate a modified example of the injector. FIGS. 7A and 7B are a perspective view and a cross-sectional view schematically illustrating an injector according to this example embodiment, respectively.

With reference to FIGS. 7A and 7B, an injector 300B according to an example embodiment may include a body part 370 having a screw thread 371 on a surface (e.g., a side surface of the body part 370), and a flange part 380 extending radially away from the body part 370. In other words, the injector 300B according to an example embodiment includes the screw thread 371 on a surface of the body part 370 to allow the injector 300B to be detachably or releasably fastened to the fastening hole 210 of the window plate 200 in a manner different from the injector 300 according to an example embodiment in FIG. 1.

In detail, the body part 370 having a cylindrical structure may include the screw thread 371 on a surface. In addition, the fastening hole 210 of the window plate 200 may have a screw thread 211 that engages with the screw thread 371 of the body part 370.

The injector 300B according to an example embodiment may be fastened to or separated from the window plate 200 in a screw fastening method as the screw thread 371 of the body part 370 is engaged with the screw thread 211 of the fastening hole 210. In this case, the stopper 400 in the injector 300 according to an example embodiment in FIG. 1 may be omitted.

Figure 8:
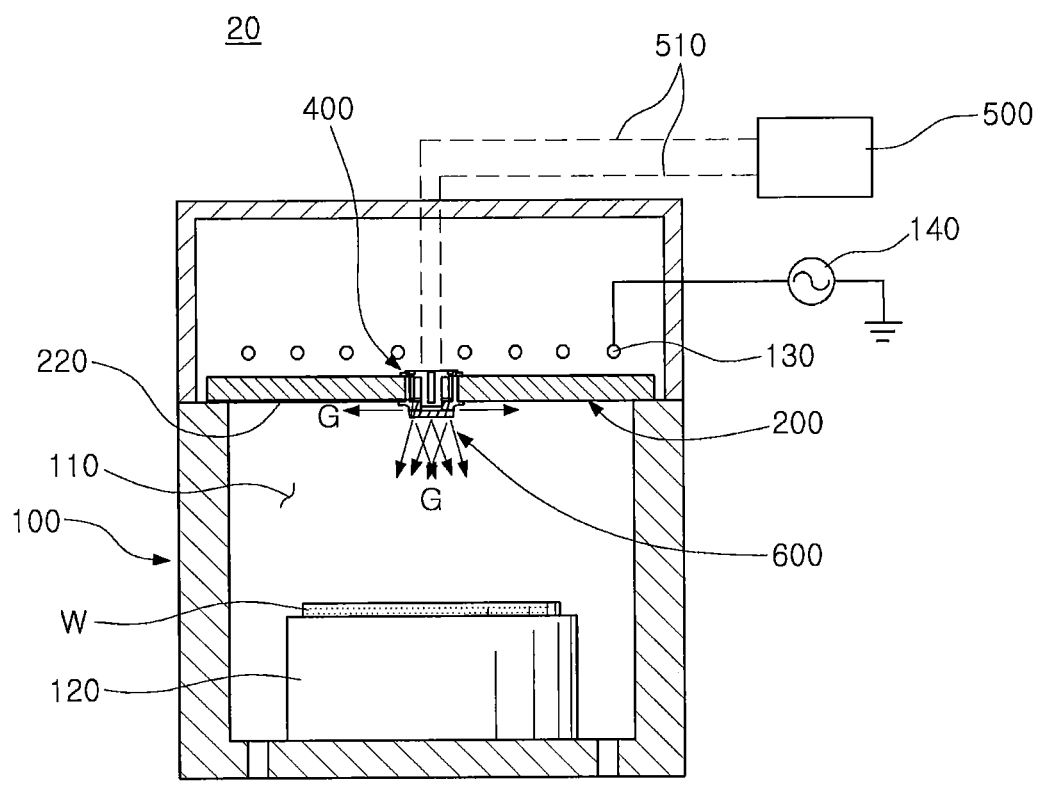
FIG. 8 is a cross-sectional view schematically illustrating a plasma processing apparatus according to an example embodiment.

With reference to FIG. 8, a plasma processing apparatus according to an example embodiment is described below. FIG. 8 is a cross-sectional view schematically illustrating a plasma processing apparatus according to an example embodiment.

With reference to FIG. 8, a plasma processing apparatus 20 according to an example embodiment may include a chamber 100, a window plate 200, and an injector 600.

The chamber 100 may define or provide an internal space 110 in which a processing process with respect to a wafer W is performed, and a support member 120 on which the wafer W is disposed may be at a lower portion of the internal space 110.

The window plate 200 may have a fastening hole 210 and may be disposed in an upper portion of the chamber 100 to seal the internal space 110. The window plate 200 may have a protective layer 220 coated with, for example, yttrium oxide ($Y_2O_3$) on a bottom surface facing or exposed to the internal space 110.

The chamber 100 and the window plate 200 in FIG. 8 may have a structure substantially corresponding to the chamber 100 and the window plate 200 in FIG. 1. Thus, detailed descriptions with respect to the chamber 100 and the window plate 200 may be understood with reference to an example embodiment described previously, and a detailed description thereof is omitted.

Figure 9A:
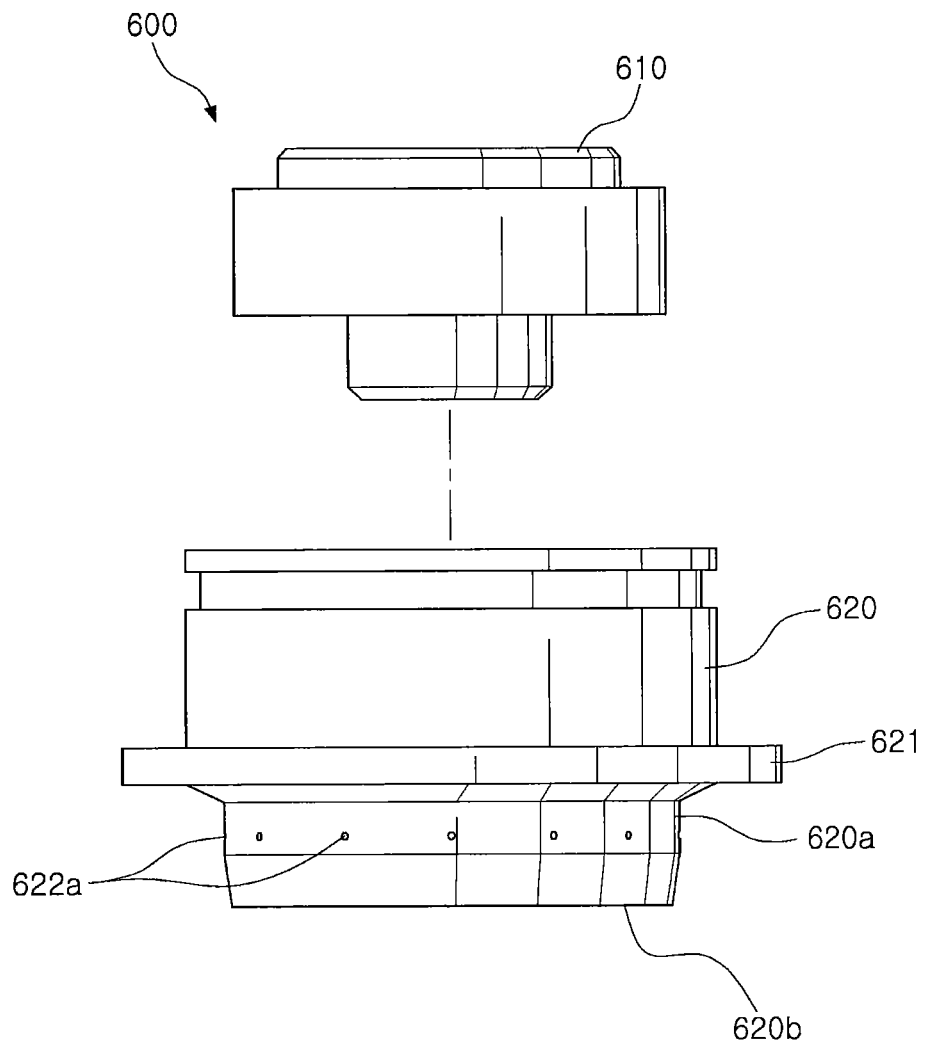
FIGS. 9A and 9B are a side view and a perspective view schematically illustrating an injector in the plasma processing apparatus of FIG. 8.
Figure 9B:
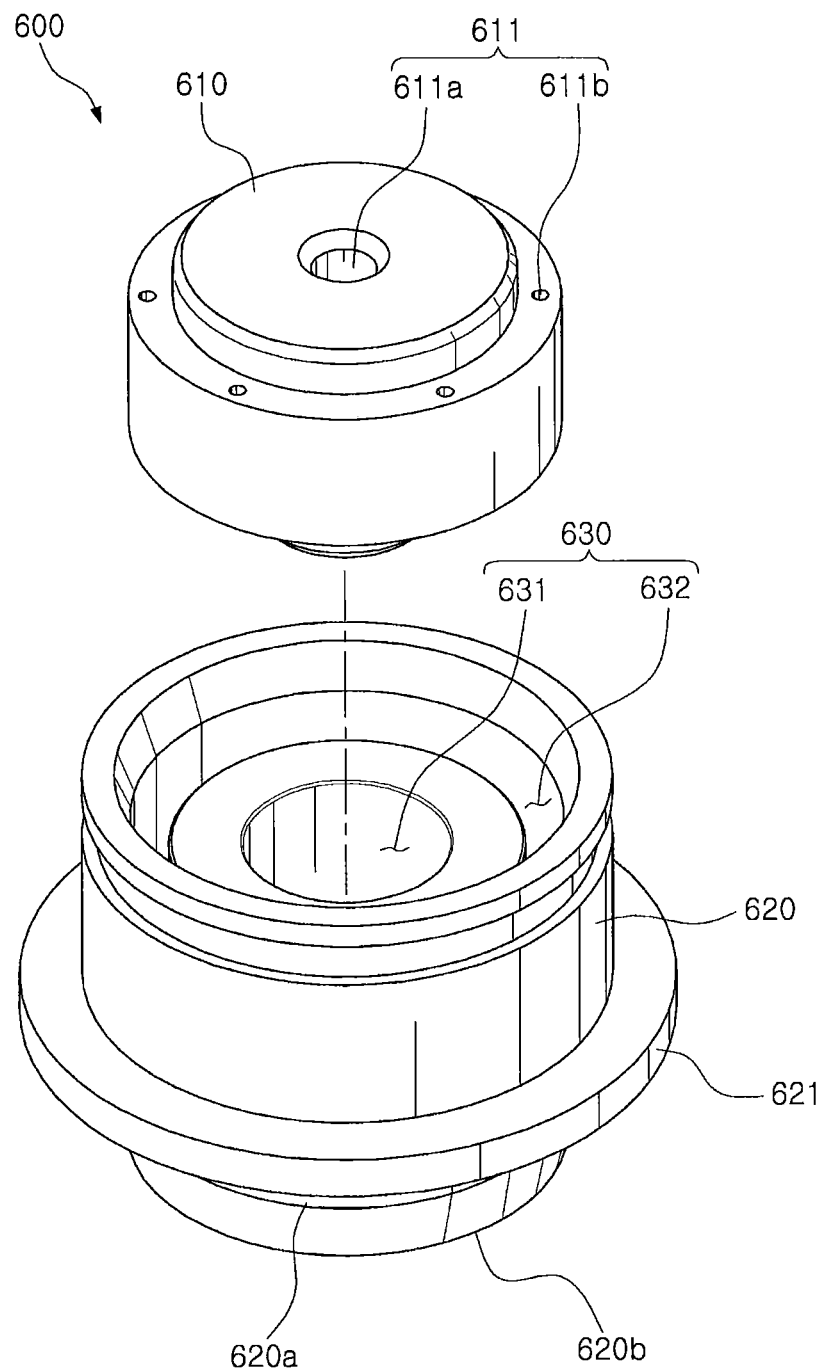
Figure 10A:
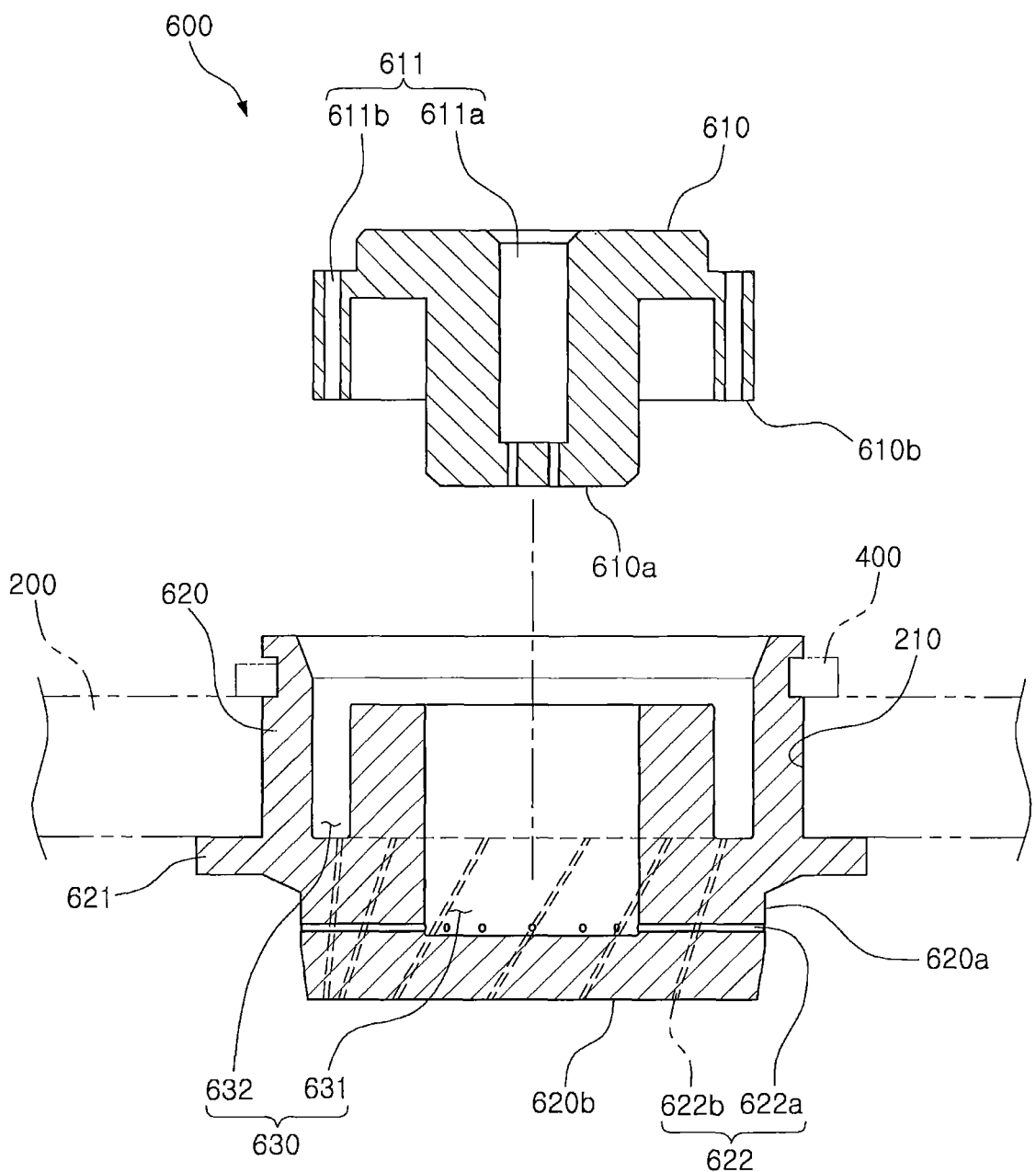
FIG. 10A is a cross-sectional view schematically illustrating the injector of FIG. 9A.
Figure 10B:
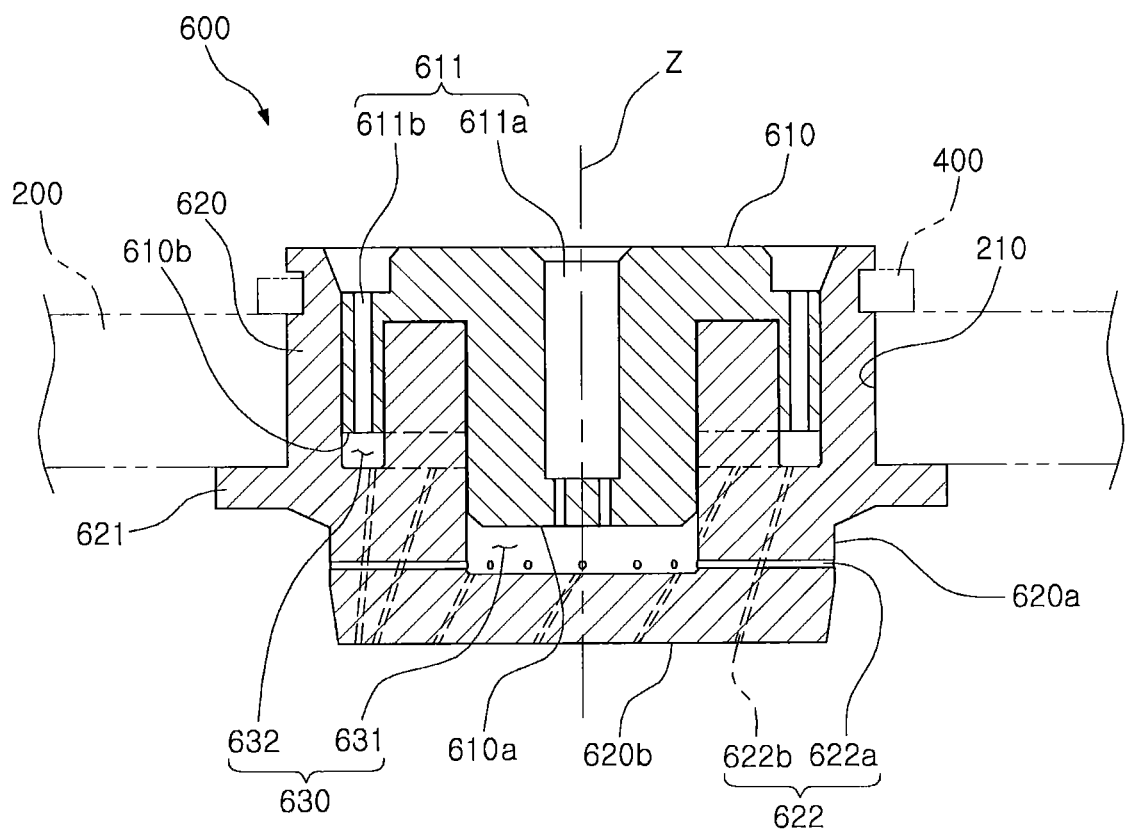
FIG. 10B is a cross-sectional view schematically illustrating a state in which components of the injector of FIG. 10A are combined.

With reference to FIGS. 9A to 10B, the injector 600 is described in more detail. FIGS. 9A and 9B are a side view and a perspective view schematically illustrating an injector in the plasma processing apparatus of FIG. 8, respectively. In addition, FIG. 10A is a cross-sectional view schematically illustrating the injector in FIG. 9A, and FIG. 10B is a cross-sectional view schematically illustrating a state in which components of the injector in FIG. 10A are combined.

With reference to FIGS. 9A to 10B, the injector 600 may be detachably or releasably mounted on or to the fastening hole 210 of the window plate 200. The injector 600 may include a first body 610 and a second body 620 having a mutually fastened structure.

As illustrated in FIGS. 10A and 10B, the second body 620 may be disposed in the fastening hole 210. A side wall of the second body 620 may be in the fastening hole 210. The second body 620 may have a flange part 621 that extends radially (e.g., radially outwardly from the side wall of the second body 620). When the second body 620 is disposed in the fastening hole 210, the flange part 621 may partially cover a bottom surface of the window plate 200. In other words, the flange part 621 may cover a region around the fastening hole 210.

The flange part 621 may be integrated with the second body 620 or may have a through hole into which the second body 620 is inserted and the flange part 621 fastened or secured to the second body 620.

The second body 620 may have an accommodating groove 630. The accommodating groove 630 may have a form or shape corresponding to that of the first body 610, and the first body 610 may be inserted into the accommodating groove 630 and fastened to the second body 620.

The accommodating groove 630 may include a first accommodating groove 631 disposed in a center or central portion of the second body 620, and a second accommodating groove 632 disposed around the first accommodating groove 631.

The first accommodating groove 631 may have a substantially cylindrical shape or structure. The second accommodating groove 632 may have a ring-shaped shape or structure surrounding the first accommodating groove 631. A bottom surface of the first accommodating groove 631 may be located at a lower level of a bottom surface of the second accommodating groove 632. In other words, the first accommodating groove 631 may extend deeper in the second body 620 than does the second accommodating groove 632. Alternatively, a bottom surface of the second accommodating groove 632 may be located at a lower level of a bottom surface of the first accommodating groove 631.

The second body 620 may have a plurality of injection nozzles 622 for injecting the process gas G into the interior of the chamber 100. The plurality of injection nozzles 622 may include first injection nozzles 622a and second injection nozzles 622b.

The first injection nozzles 622a may extend radially in a horizontal or lateral direction from the first accommodating groove 631 to be connected to an outer lateral or side surface 620a of the second body 620. The second injection nozzles 622b may extend downwardly from the second accommodating groove 632 to be connected to a lower surface 620b of the second body 620.

Figure 11A:
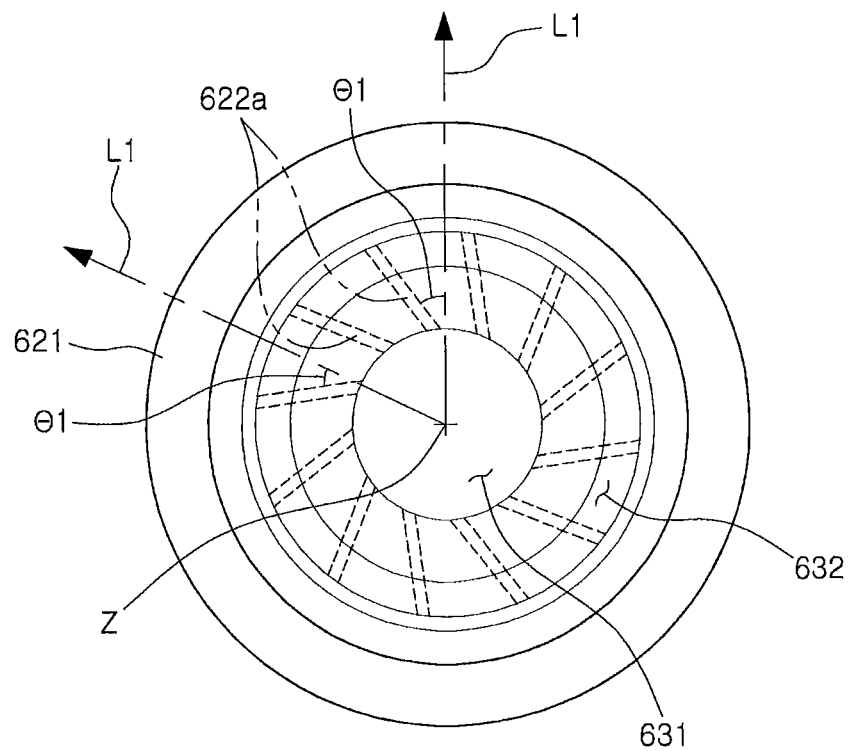
FIG. 11A is a plan view schematically illustrating a first injection nozzle in the injector of FIGS. 10A and 10B.

FIG. 11A schematically illustrates a first injection nozzle when the injector is viewed from directly above. With reference to FIG. 11A, when viewed from above, each of the first injection nozzles 622a may have a structure rotated while being at an acute angle θ1 with relation to a straight line L1 extending in a normal direction from a central or longitudinal axis Z of the first accommodating groove 631, based on a point that the straight line L1 meets an inner lateral surface of the first accommodating groove 631 at the first injection nozzle 622a. Here, all rotation directions of the first injection nozzles 622a may be the same. In an example embodiment, the first injection nozzles 622a are rotated in a counterclockwise direction, but the inventive concept is not limited thereto. Alternatively, the first injection nozzles may be rotated in a clockwise direction.

Figure 11B:
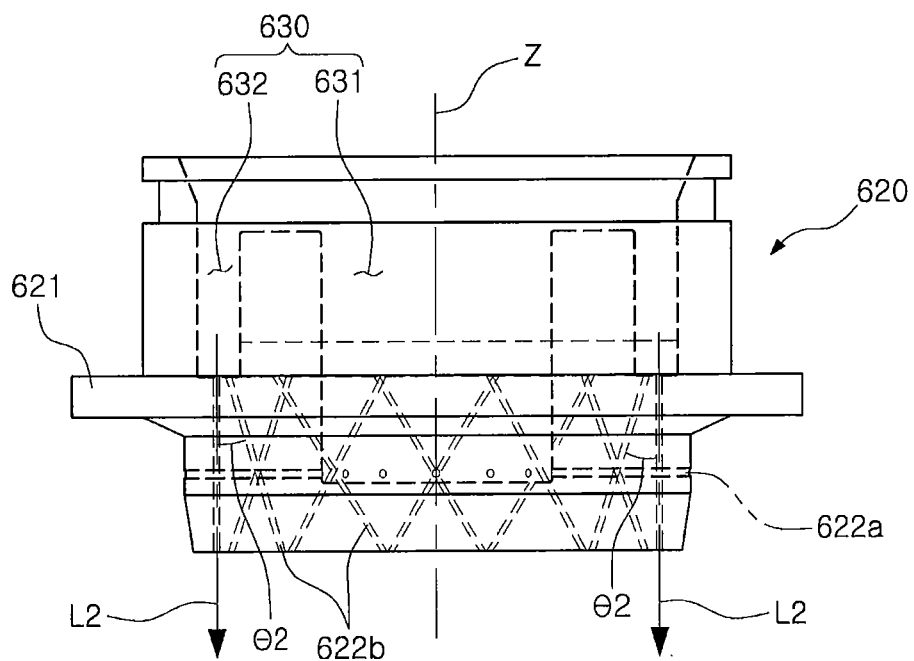
FIG. 11B is a cross-sectional view schematically illustrating a second injection nozzle in the injector of FIGS. 10A and 10B.

FIG. 11B schematically illustrates a second injection nozzle when the injector is viewed from a side direction. With reference to FIG. 11B, each of the second injection nozzles 622b may have a structure extending at an incline in the same direction toward the lower surface 620b of the second body 620 from the second accommodating groove 632 while being at an acute angle θ2 with relation to a vertical line L2 parallel to the central axis Z of the first accommodating groove 631, based on a point that the vertical line L2 meets a bottom surface of the second accommodating groove 632 at the second injection nozzle 622b.

With reference to FIGS. 10A and 10B, the first body 610 may have a plurality of distribution nozzles 611 for receiving a process gas G from an external source to distribute the process gas G to the second body 620. The plurality of distribution nozzles 611 may include a first distribution nozzle 611a and a second distribution nozzle 611b.

The first distribution nozzle 611a may be disposed in a center or central portion of the first body 610 to be located or positioned inside the first accommodating groove 631 of the second body 620. The first distribution nozzle 611a may be connected (e.g., fluidly connected) to a first injection nozzle 622a in the first accommodating groove 631.

The second distribution nozzle 611b may be disposed around the first distribution nozzle 611a to be located or positioned inside the second accommodating groove 632 of the second body 620. The second distribution nozzle 611b may be connected (e.g., fluidly connected) to a second injection nozzle 622b in the second accommodating groove 632.

The injector 600 may have a space for accommodating the process gas G between the first body 610 and the second body 620 while the first body 610 is disposed or positioned inside the accommodating groove 630 of the second body 620.

In detail, in the first body 610, lower surfaces 610a and 610b, to which the first distribution nozzle 611a and the second distribution nozzle 611b are connected, may be disposed to be spaced apart by a predetermined distance without contacting bottom surfaces of the first accommodating groove 631 and the second accommodating groove 632, respectively. In the first accommodating groove 631 and the second accommodating groove 632, a space formed between the first body 610 and the second body 620 may correspond to a type of reservoir.

The space may allow the process gas G to be uniformly distributed to be uniformly injected into the interior of the chamber 100. In other words, the process gas G distributed to the first accommodating groove 631 and the second accommodating groove 632 through the first distribution nozzle 611a and the second distribution nozzle 611b may be uniformly distributed to the first injection nozzle 622a and the second injection nozzle 622b in spaces of the first accommodating groove 631 and the second accommodating groove 632, respectively, and may be uniformly injected into the interior of the chamber 100 through the first injection nozzle 622a and the second injection nozzle 622b.

The injector 600 may be detachably or releasably fastened to the fastening hole 210 through or using the stopper 400 fastened to the second body 620 at an upper surface of the window plate 200.

The stopper 400 may be fastened to a part of the second body 620 protruding from an upper surface of the window plate 200 when the second body 620 is disposed in the fastening hole 210.

The injector 600 according to an example embodiment may have a two-piece structure in which the first body 610 for uniformly distributing the process gas G and the second body 620 for uniformly injecting the distributed process gas G are configured to be separated from each other, and thus, only the second body 620 exposed to plasma inside the chamber 100 may be replaced to reduce costs for maintenance.

The injector 600 according to an example embodiment injects the process gas G in different directions, a lateral or radial direction and a downward direction, to increase a mixture of the process gas G inside the chamber 100. In detail, in the case of the process gas G radially injected in a lateral direction of the injector 600, the first injection nozzle 622a has a structure rotated at a predetermined angle with respect to a normal direction, and thus, the injected process gas G may be rotated along a circumference of the injector 600 to form a flow field which is spread radially.

In the case of the process gas G injected in a downward direction of the injector 600, the second injection nozzle 622b has a structure extended at an incline downwardly, and thus, the injected process gas G may form a vortex, spirally rotating to form a flow field spread.

As described above, the process gases G injected in the lateral or radial direction and in the downward direction of the injector 600, respectively, are injected at predetermined injection angles θ1 and θ2. Thus, the process gases G may not be simply spread inside the chamber 100 but spread while forming a flow field forming a vortex, whereby a mixture of the process gas G inside the chamber 100 is increased to improve distribution.

Figure 12A:
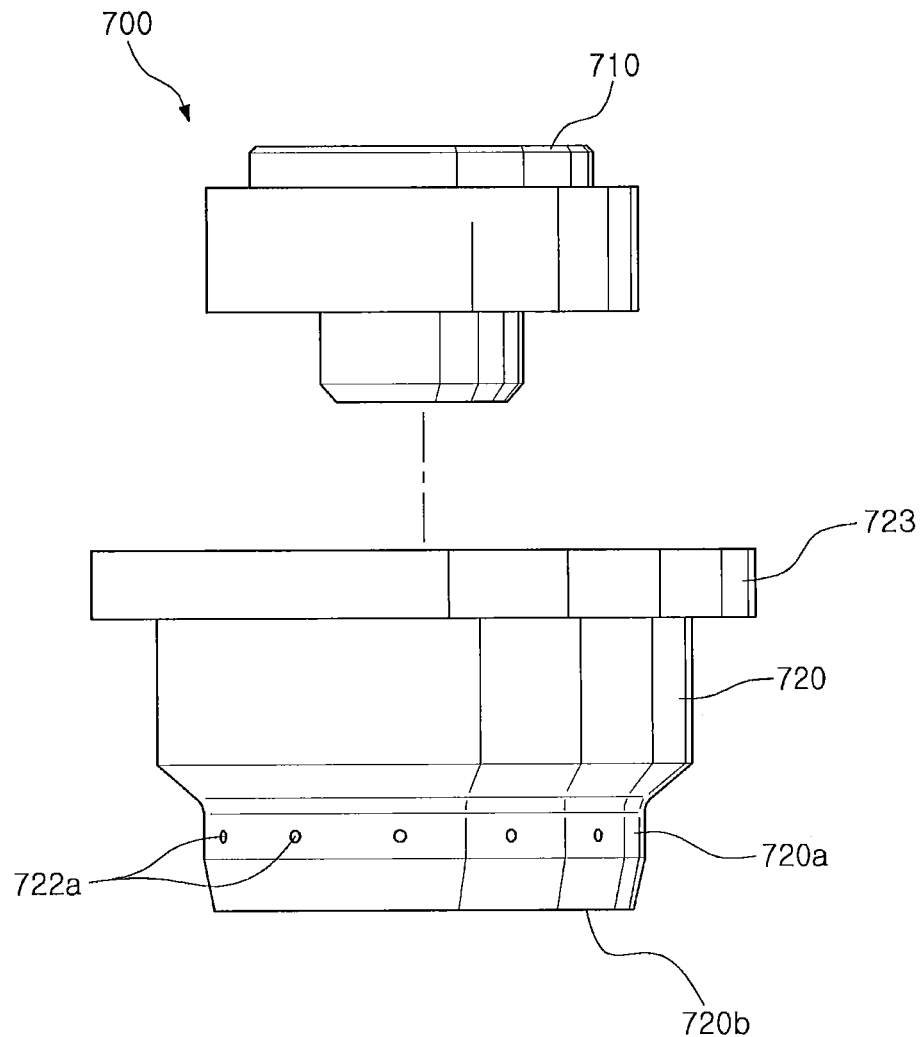
FIGS. 12A and 12B are a side view and a perspective view schematically illustrating an injector according to an example embodiment.
Figure 12B:
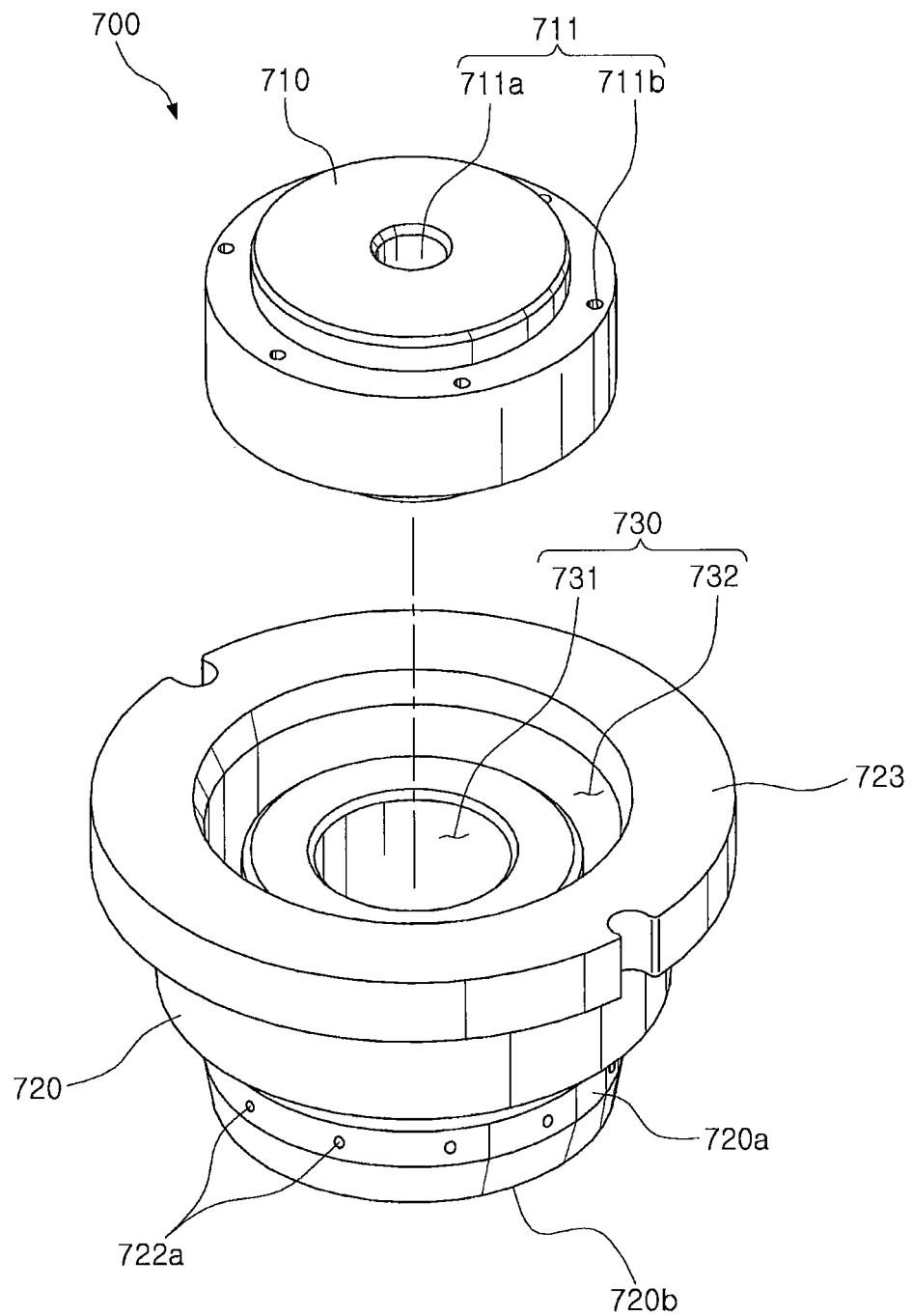

FIGS. 12A and 12B schematically illustrate a modified example of the injector. FIGS. 12A and 12B are a side view and a perspective view schematically illustrating this example embodiment, respectively.

With reference to FIGS. 12A and 12B, an injector 700 may include a first body 710 and a second body 720 having a mutually fastened structure.

The first body 710 may have a plurality of distribution nozzles 711. The plurality of distribution nozzles 711 may include a first distribution nozzle 711a and a second distribution nozzle 711b.

The second body 720 may have an accommodating groove 730. The accommodating groove 730 may include a first accommodating groove 731 disposed in a center or central portion of the second body 720, and a second accommodating groove 732 disposed around the first accommodating groove 731.

The second body 720 may have a plurality of injection nozzles 722. The plurality of injection nozzles 722 may include first injection nozzles 722a and second injection nozzles (not shown). The first injection nozzles 722a may extend radially away from the first accommodating groove 731 in a horizontal or lateral direction to be connected to an outer lateral or side surface 720a of the second body 720. The second injection nozzles (not shown) may extend from the second accommodating groove 732 in a downward direction to be connected to a lower surface 720b of the second body 720.

A configuration and a structure of the first body 710 and the second body 720 may be substantially the same as that of the first body 610 and the second body 620 forming the injector 600 according to an example embodiment of FIGS. 9A to 11B. Thus, detailed descriptions with respect to the first body 710 having the plurality of distribution nozzles 711 and the second body 720 having the accommodating groove 730, a first injection nozzle 722a, and a second injection nozzle (not shown) may be understood with reference to an example embodiment described previously.

The second body 720 may have a stop projection 723 that is stepped from the outer lateral surface 720a in an upper part or portion of the second body 720. The stop projection 723 may be integrated with the second body 720, and may help prevent the second body 720 from being detached downwardly as the second body 720 is caught by and fixed to an upper surface of the window plate 200 when the second body 720 is inserted into the fastening hole 210 of the window plate 200.

As required, a flange part (not shown) having a through hole may be further mounted on the outer lateral surface 720a of the second body 720 (referring to FIG. 6).

Figure 13A:
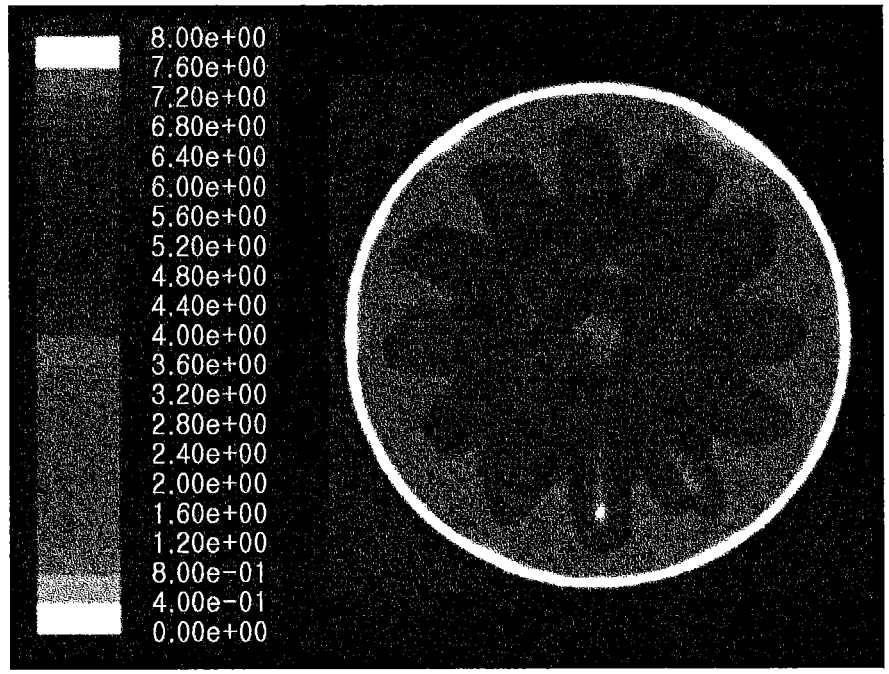
FIGS. 13A and 13B illustrate results in which process gas distribution is simulated inside a vacuum chamber with respect to the use of an injector according to a comparative example and an injector according to an example embodiment.
Figure 13B:
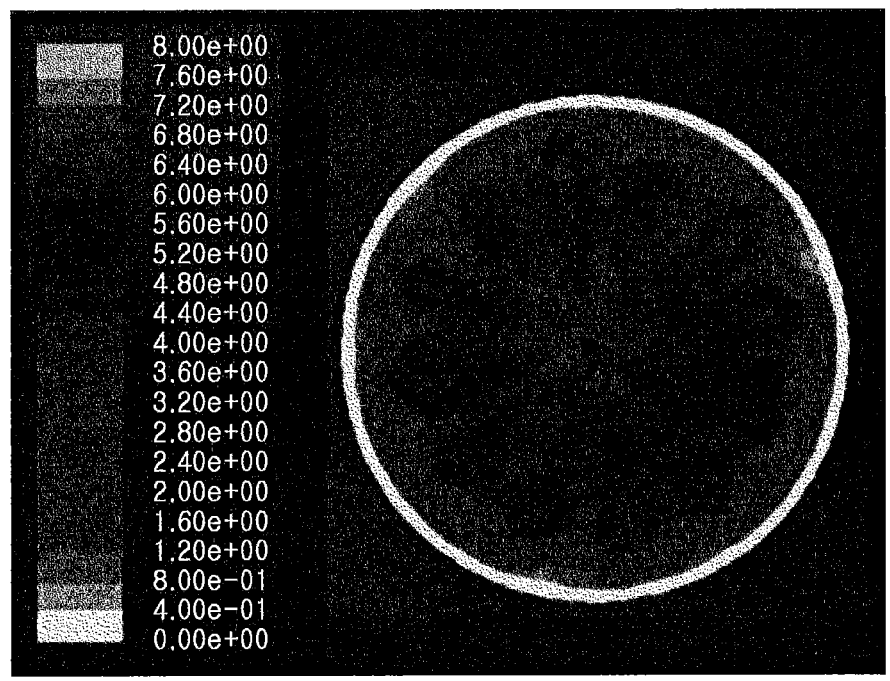

FIGS. 13A and 13B show results in which process gas distribution is simulated inside a vacuum chamber using a computational fluid dynamics (CFD) method with respect to the use of an injector according to a comparative example and an injector according to an example embodiment. Here, the injector according to a comparative example may be understood to have a structure with a nozzle for injecting a gas in a vertical direction according to the related art.

As compared to process gas distribution in the case in which the injector according to a comparative example is used as illustrated in FIG. 13A, when the injector according to an example embodiment is used as illustrated in FIG. 13B, distribution is confirmed to be substantially improved, which may be interpreted as increasing a mixture of process gases inside a chamber due to strengthening of the rotational momentum (circular momentum).

As set forth above, according to example embodiments of the present inventive concept, a plasma processing apparatus for addressing structural vulnerabilities of a window plate and implementing uniform dispersion of a process gas inside a chamber may be provided.

While example embodiments have been shown and described above, it will be apparent to those skilled in the art that modifications and variations could be made without departing from the scope of the present disclosure as defined by the appended claims.

What is claimed is:

1. A plasma processing apparatus comprising:
a chamber;
a window plate disposed in an upper portion of the chamber and having a hole; and
an injector configured to be disposed in the hole, the injector having a plurality of distribution nozzles for distributing a process gas, and a plurality of injection nozzles connected to the plurality of distribution nozzles and inclined along a circumference of the injector toward a lower surface of the injector,
wherein the injector comprises
a first body in which the plurality of distribution nozzles are disposed, and
a second body having an accommodating groove to which the first body is accommodated and in which the plurality of injection nozzles are disposed.

2. The plasma processing apparatus of claim 1, wherein the plurality of injection nozzles are inclined in the same direction with respect to a central axis of the injector, respectively.

3. The plasma processing apparatus of claim 2, wherein the same direction is a counterclockwise direction.

4. The plasma processing apparatus of claim 1, wherein the accommodating groove comprises a first accommodating groove disposed in a central portion of the first body, and a second accommodating groove disposed around the first accommodating groove, and
wherein a bottom surface of the first accommodating groove is located at a lower vertical level than a bottom surface of the second accommodating groove.

5. The plasma processing apparatus of claim 4, wherein a lower surface of the first body is spaced apart from the bottom surface of the first accommodating groove and from the bottom surface of the second accommodating groove by a predetermined distance.

6. The plasma processing apparatus of claim 4, wherein the first accommodating groove has a cylindrical structure, and the second accommodating groove has a ring-shaped structure disposed around the first accommodating groove.

7. The plasma processing apparatus of claim 4, wherein the plurality of injection nozzles extend downwardly from the second accommodating groove to connect to the lower surface of the injector.

8. The plasma processing apparatus of claim 4, wherein the plurality of distribution nozzles comprise first distribution nozzles disposed in a center portion of the first body and located inside the first accommodating groove, and second distribution nozzles disposed around the first distribution nozzles and located inside the second accommodating groove.

9. The plasma processing apparatus of claim 8, wherein the second distribution nozzles are connected to the injection nozzles in the second accommodating groove.

10. The plasma processing apparatus of claim 1, wherein, when the first body of the injector is disposed in the accommodating groove, the injector has a space defined between the first body and the second body for accommodating the process gas between the first body and the second body.

11. The plasma processing apparatus of claim 1, wherein the second body has a flange part extending radially outwardly to partially cover a bottom surface of the window plate.

12. A plasma processing apparatus comprising:
a chamber;
a window plate disposed in an upper portion of the chamber and having a hole;
a support member disposed in a lower portion of the chamber;
an antenna disposed above the window plate;
a power source for supplying power to the antenna; and
an injector having a body part configured to be fastened to the hole, the body part having a plurality of nozzles and a planar lower surface,
wherein the plurality of nozzles comprise a plurality of first nozzles disposed radially in a horizontal and lateral direction from a central axis of the body part and to be at an acute angle to a horizontal line perpendicular to the central axis of the body part, and a plurality of second nozzles disposed to be inclined along a circumference of the injector toward a lower surface of the injector and to be at an acute angle to a vertical line parallel to the central axis of the body part,
wherein the body part comprises
a first body, and
a second body having an accommodating groove to which the first body is accommodated and in which the plurality of nozzles are disposed.

13. The plasma processing apparatus of claim 12, wherein the plurality of first nozzles extend radially from the central axis to be connected to an outer lateral surface of the body part.

14. The plasma processing apparatus of claim 12, wherein the plurality of second nozzles are spirally disposed along the circumference of the injector toward the lower surface of the injector.

* * * * *